(12) United States Patent
Dani

(10) Patent No.: US 9,727,572 B2
(45) Date of Patent: Aug. 8, 2017

(54) DATABASE COMPRESSION SYSTEM AND METHOD

(71) Applicant: Openwave Mobility Inc., Redwood City, CA (US)

(72) Inventor: Manoj Dani, Sunnyvale, CA (US)

(73) Assignee: Openwave Mobility Inc., Redwood City, CA (US)

( * ) Notice: Subject to any disclaimer, the term of this patent is extended or adjusted under 35 U.S.C. 154(b) by 293 days.

(21) Appl. No.: 14/141,578

(22) Filed: Dec. 27, 2013

(65) Prior Publication Data

US 2014/0108364 A1    Apr. 17, 2014

Related U.S. Application Data

(63) Continuation of application No. PCT/US2012/045036, filed on Jun. 29, 2012.

(60) Provisional application No. 61/503,079, filed on Jun. 30, 2011.

(51) Int. Cl.
*G06F 17/00* (2006.01)
*G06F 17/30* (2006.01)
*H03M 7/40* (2006.01)

(52) U.S. Cl.
CPC .. *G06F 17/30153* (2013.01); *G06F 17/30067* (2013.01); *H03M 7/40* (2013.01)

(58) Field of Classification Search
CPC ......... G06F 12/0246; G06F 2221/2149; G06F 17/30457; G06F 17/30749
See application file for complete search history.

(56) References Cited

U.S. PATENT DOCUMENTS

| | | | |
|---|---|---|---|
| 9,009,146 B1* | 4/2015 | Lopatenko | G06F 17/30867 707/723 |
| 2003/0130855 A1 | 7/2003 | Babu | |
| 2011/0066437 A1* | 3/2011 | Luff | G06Q 30/02 704/254 |
| 2013/0124524 A1* | 5/2013 | Anderson | G06F 17/30286 707/737 |
| 2013/0268916 A1* | 10/2013 | Misra | G06F 8/74 717/123 |
| 2014/0074853 A1* | 3/2014 | Nath | G06F 17/30457 707/743 |

OTHER PUBLICATIONS

Raman et al. "How to Wring a Table Dry: Entropy Compression of Relations and Querying of Compressed Relations", VLDB '06, Sep. 12-15, 2006, Seoul, Korea.

(Continued)

*Primary Examiner* — Mariela Reyes
*Assistant Examiner* — Courtney Harmon
(74) *Attorney, Agent, or Firm* — EIP US LLP

(57) ABSTRACT

A database compression system includes and analyzer, a counting engine, and a mapping engine. The analyzer analyzes a schema of a database by maintaining a list of attributes and corresponding values. The analyzer also analyzes a selection of entries in the database. The counting engine determines a frequency of occurrence of each attribute/value pair in the selection of entries. The mapping engine assigns a condensed code to a character string determined on the basis of the attribute/value pair with a highest frequency of occurrence.

19 Claims, 12 Drawing Sheets

| Attribute/value pair | Frequency of Occurrence (count) |
|---|---|
| Cn: Joe | 2 |
| Cn: Mary | 1 |
| Cn: Lisa | 1 |
| Cn: James | 1 |
| Cn: John | 1 |
| Sn: Taylor | 2 |
| Sn: Brown | 1 |
| Sn: Chen | 1 |
| Sn: Parker | 1 |
| Sn: Smith | 1 |
| Smscapable: y | 3 |
| Smscapable: n | 3 |
| Cos: default | 4 |
| Cos: premium | 1 |
| Cos: administrator | 1 |
| mail: joe.brown@domain.com | 1 |
| mail: mary.taylor@domain.com | 1 |
| mail: lisa.chen@domain.com | 1 |
| mail: joe.parker@domain.com | 1 |
| mail: james.taylor@domain.com | 1 |
| mail: john.smith@domain.com | 1 |
| Creator: root | 5 |
| Creator: customercare | 1 |

(56) References Cited

OTHER PUBLICATIONS

Nelson, "The Data Compression Book", M&T Books, XP002684024, 1996; p. 29.
Gorthi et al. "Algorithm for Compression of LDAP Entries using DN Pointers", ip.com Journal, West Henrietta, NY, Oct. 2008.
International Search Report issued Jan. 21, 2013 for related application PCT/US2012/045036 filed Jun. 29, 2012 (Published WO2013/003770 on Jan. 3, 2013).
Vijayshankar Raman et al: "Constant-Time Query Processing", 24th International Conference on Data Engineering, Apr. 7, 2008, pp. 60-69, XP031245963, ISBN: 978-1-4244-1836-7.
Haiming Huang: "Lossless Semantic Compression for Relational Databases", Nov. 1, 2001, pp. i-x, 1-61, XP055177127, Retrieved from the Internet: URL:http://citeseerx.ist.psu.edu/viewdoc/download? doi=10.1.1.69.3972&rep=rep1 &type=pdf[retrieved on Mar. 17, 2015].
Cooper D et al: "Text compression using variable- to fixed-length encodings", Journal of the American Society for Information Science,vol. 33, No. 1, Jan. 1, 1982, pp. 18-31, XP002515613, ISSN: 0002-8231, DOI: 10.1 002/ASI.46303301 05.

\* cited by examiner

| Attribute/value pair | Frequency of Occurrence (count) |
|---|---|
| Cn: Joe | 2 |
| Cn: Mary | 1 |
| Cn: Lisa | 1 |
| Cn: James | 1 |
| Cn: John | 1 |
| Sn: Taylor | 2 |
| Sn: Brown | 1 |
| Sn: Chen | 1 |
| Sn: Parker | 1 |
| Sn: Smith | 1 |
| Smscapable: y | 3 |
| Smscapable: n | 3 |
| Cos: default | 4 |
| Cos: premium | 1 |
| Cos: administrator | 1 |
| mail: joe.brown@domain.com | 1 |
| mail: mary.taylor@domain.com | 1 |
| mail: lisa.chen@domain.com | 1 |
| mail: joe.parker@domain.com | 1 |
| mail: james.taylor@domain.com | 1 |
| mail: john.smith@domain.com | 1 |
| Creator: root | 5 |
| Creator: customercare | 1 |

Figure 5a

| Attribute/value pair | Frequency of Occurrence (count) |
|---|---|
| Creator: root | 5 |
| Cos: default | 4 |
| Smscapable: y | 3 |
| Smscapable: n | 3 |
| Cn: Joe | 2 |
| Sn: Taylor | 2 |
| Cn: Mary | 1 |
| Cn: Lisa | 1 |
| Cn: James | 1 |
| Cn: John | 1 |
| Sn: Brown | 1 |
| Sn: Chen | 1 |
| Sn: Parker | 1 |
| Sn: Smith | 1 |
| Cos: premium | 1 |
| Cos: administrator | 1 |
| mail: joe.brown@domain.com | 1 |
| mail: mary.taylor@domain.com | 1 |
| mail: lisa.chen@domain.com | 1 |
| mail: joe.parker@domain.com | 1 |
| mail: james.taylor@domain.com | 1 |
| mail: john.smith@domain.com | 1 |
| Creator: customercare | 1 |

Figure 5b

DATABASE COMPRESSION SYSTEM AND METHOD

CROSS-REFERENCE TO RELATED APPLICATIONS

This application is a continuation under 35 U.S.C §120 of International Application No. PCT/US2012/045036 filed Jun. 29, 2012 (and published in the English language by the International Bureau as WO2013/003770 on Jan. 3, 2013), which claims the benefit of U.S. Provisional Patent Application No. 61/503,079, filed Jun. 30, 2011. Each of the above referenced patent applications is hereby incorporated by reference in its entirety.

BACKGROUND OF THE INVENTION

Field of the Invention

This application relates to a database compression system and method.

Description of the Related Technology

A database is an organized collection of data usually stored in digital form. There are many database designs and implementations, but the general concept common to all is to be able to store, update, and/or retrieve data from the database. Databases generally organize information in the forms of tables and records or entries. Each record or entry may have multiple fields or "attributes" with each attribute having a variety of possible values.

Depending upon the environment, database performance is critical to the system and/or the end-user experience. This performance, typically measured in read/write times, often determines the type of database used and the storage device upon which the database is implemented. The type of storage device generally is a hard disk drive or a pool of hard disk drives. Hard disk drives are popular because they are relatively affordable for the storage capacity offered. However, hard disk drives suffer from slow disk access times. To improve performance, many database systems are being implemented with solid state drives (SSD). The SSD is a data storage device that uses solid-state memory to store data, and offers markedly improved data access times that significantly speed up database performance. However, SSDs are expensive, and the ever increasing amount of data to be stored in the SSD-based database only exacerbates the issue.

SUMMARY

In a first exemplary embodiment, there is a database compression system comprising: an analyzer configured to analyze a schema of a database by maintaining a list of attributes and corresponding values and analyze a selection of entries in the database; a counting engine configured to determine a frequency of occurrence of each attribute/value pair in the selection of entries; and a mapping engine configured to assign a condensed code to a character string, the character string being determined on the basis of the attribute/value pair with a highest frequency of occurrence.

In a second exemplary embodiment, there is a method comprising: analyzing a schema of a database by maintaining a list of attributes and corresponding values and analyzing a selection of entries in the database; determining a frequency of occurrence of each attribute/value pair in the selection of entries; and assigning a condensed code to a character string determined, the character string being on the basis of the attribute/value pair with a highest frequency of occurrence.

In a third exemplary embodiment, there is a non-transitory computer-readable storage medium comprising a set of computer-readable instructions stored thereon, which when executed by a processing system, cause the processing system to carry out a method comprising: analyzing a schema of a database by maintaining a list of attributes and corresponding values and analyzing a selection of entries in the database; determining a frequency of occurrence of each attribute/value pair in the selection of entries; and assigning a condensed code to a character string, the character string being determined on the basis of the attribute/value pair with a highest frequency of occurrence.

Aspects of the invention enable a high degree of compression of data stored in databases.

Further features and advantages of the invention will become apparent from the following description of preferred embodiments of the invention, given by way of example only, which is made with reference to the accompanying drawings.

BRIEF DESCRIPTION OF THE DRAWINGS

FIG. 5a is a table showing frequency of occurrence counts for each attribute/value pair in an exemplary database FIG. 5b is a table showing sorted frequency of occurrence counts for each attribute/value pair in an exemplary database

Throughout the description, similar reference numbers may be used to identify similar elements.

DETAILED DESCRIPTION OF CERTAIN INVENTIVE EMBODIMENTS

Figure 1:
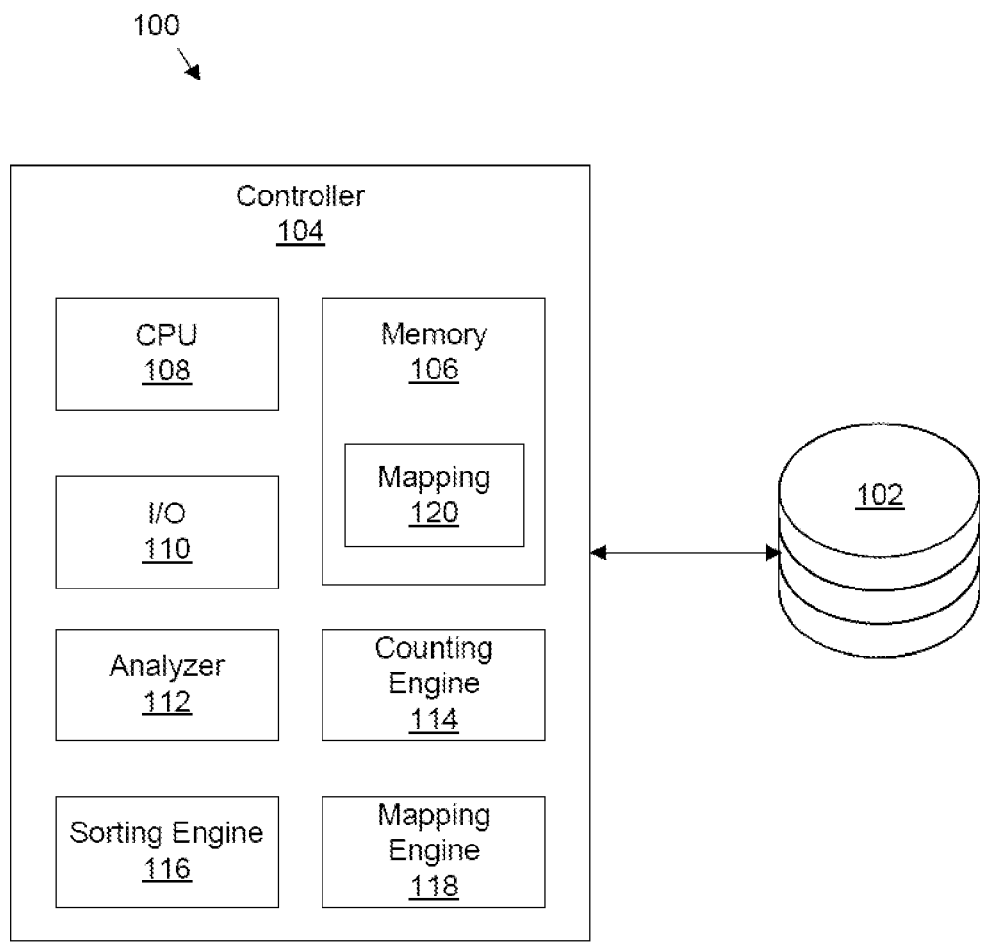
FIG. 1 is a schematic block diagram illustrating one embodiment of a system for database compression using condensed codes.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

While many embodiments are described herein, at least some of the embodiments implement a database compression system. In particular, the embodiments described herein provide a way to identify repeated character strings such as values, attribute/value pairs, and combinations of attribute/value pairs, assigning a condensed code to those character strings, and inserting the condensed code into the database. In this way, the database compression system can compress the database by replacing repeated character strings with condensed codes that are representative of the repeated character strings.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

FIG. 1 is a schematic block diagram illustrating one embodiment of a system 100 for database compression using condensed codes. The system 100 includes a database 102 and a controller 104 for controlling read/write operations on the database 102. The database 102 maintains an organized collection of information. One example of an organized collection of information is a user information repository. The database 102 may maintain user information that includes user preferences, user access, and other personal information. In an alternative embodiment, the database 102 is configured to store any type of information in an organized format.

In a further example, the database 102 may be a subscriber profile repository that maintains information related to mobile phone subscribers. The information maintained by the database 102 is organized into what is known as a "database schema." The database schema is the structure of the records, or entries, and tables that form the database. Using the example of a subscriber profile repository, each entry for a particular subscriber in the schema may include elements or "fields" for different categories of information, with each field having multiple possible values that can be associated with each subscriber. For instance, the fields may store data items or values including, but not limited to, the phone number of the subscriber, the capabilities of the subscriber's phone, the location of the subscriber, and the quality of service the subscriber pays for.

Various services may query the database 102 via the controller 104 to retrieve information associated with a subscriber's profile, for example, to determine a subscriber's allowed network access. The database 102 and the controller 104 may implement an application protocol for reading and writing the values over a network. One example of such a protocol is the Lightweight Directory Access Protocol (LDAP). LDAP entries, as known to those of skill in the art, are defined by a schema that governs the types of information that may be stored in the database 102. The information is stored in elements or fields known as "attributes." The schema determines which attributes may be used, the kinds of values that the attributes may have, and how other services may interact with the attributes.

The values associated with each attribute may be one of a limited choice, such as "Yes" or "No", or they may be no limit on the number of variants of values that can be attributed to an attribute, as may be the case where an attribute relates to the name of a subscriber.

The controller 104, in one embodiment, includes various components, described in more detail below, that are capable of performing the functions and operations described herein. In one embodiment, at least some of the components of the controller are implemented in a computer system. For example, the functionality of one or more components of the controller 104 may be implemented by computer program instructions stored on a computer memory device 106 and executed by a processing device 108 such as a central processing unit 108. The controller 104 may include or be connected to other components, such as disk storage drives, input/output devices 110, an analyzer 112, a counting engine 114, a sorting engine 116, and a mapping engine 118. Some or all of the components of the controller 104 may be stored on a single computer/server or on a network of computers/servers. The controller 104 may include more or fewer components or modules than those depicted herein. In some embodiments, the controller 104 may be used to implement the method described herein as depicted in FIGS. 3 to 8.

The controller 104 performs database analysis and database compression as will be described below. To perform database analysis and database compression, the controller 102 includes an analyzer 112, a counting engine 114 a sorting engine 116 and a mapping engine 118.

The analyzer 112, in one example, is capable of analyzing the schema of the database 102 and searching for attributes. As described above, attributes may have multiple choice options for attribute values (for example, an attribute may have values of "Y", "N", and "NA."), or the attributes may have so-called "free-form" values that are not limited to specific values, such as a value that represents, for example, a user's name. In any event, the analyzer 112 is arranged to analyze the attributes and corresponding values of entries in the database.

The counting engine 114 may comprise a counter arranged to increment and/or store a count a number or frequency of occurrences. The counting engine 114 may be used in conjunction with the analyzer 112 to count the results of analyses performed by the analyzer 112. For example, if the analyzer 112 is requested by the controller 104 to analyze the database 102 to determine the presence of particular attribute/value pairs, the counting engine 114 may increment its counter each time the analyzer finds an occurrence of the attribute/value pair. In a further embodiment, the counting engine 114 maintains a counter for each attribute/value combination. The counting engine 114 is arranged to store the incremented count in memory 106, so that the count can be returned to, or retrieved by, the analyzer 112.

The sorting engine 116 is arranged to work in conjunction with the analyzer 112 and the counting engine 114. The sorting engine 116 is arranged to sort the results of analyses performed by the analyzer 112 according to a relevance criteria. For example, the sorting engine 116 may sort the results of an analysis in order of frequency of occurrence as determined by the counting engine 114.

The mapping engine 118 is arranged to generate and assign codes (condensed codes) to the sorted results of analyses (sorted by the sorting engine 116 after analyses by the analyzer 112). The mapping engine 118 maintains a list of available condensed codes and assigns codes that represent character strings of data stored in the database 102 on the basis of the methods described below and depicted in FIGS. 3 to 8. The character strings may include values, attributes, attribute/value pairs, or combinations of attribute value pairs as described below.

Upon assigning the condensed codes to the character strings, the mapping engine 118 generates a mapping 120 that identifies character strings and corresponding condensed codes. The mapping 120 may be maintained in memory 106, or alternatively, in other storage devices.

The mapping 120 may be represented by a mapping table, which may be, for example, a table of character strings (values, attributes, attribute/value pairs, or combinations of attribute/value pairs) in their full form along with the corresponding condensed codes.

Figure 2:
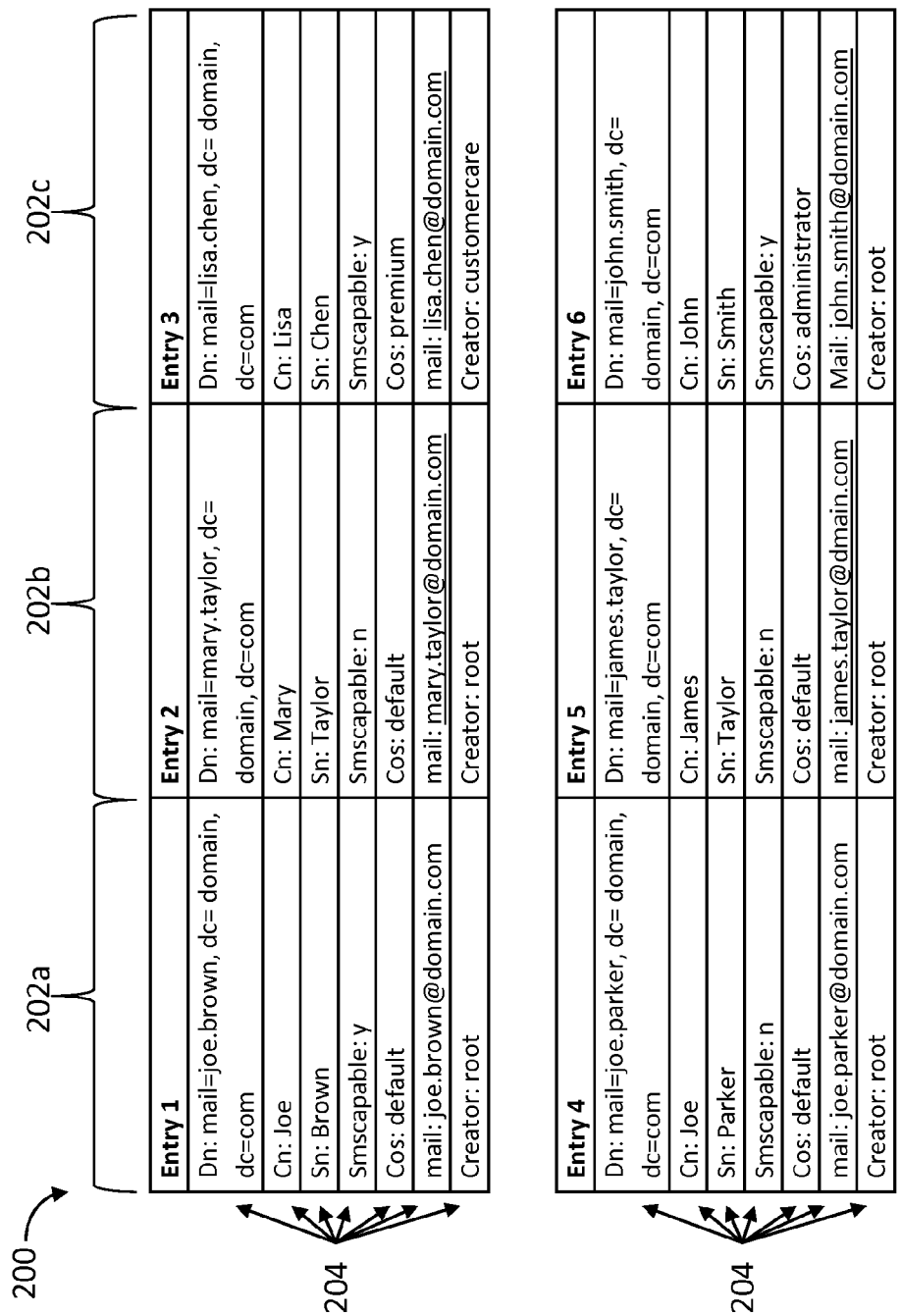
FIG. 2 is a schematic block diagram illustrating one embodiment of a schema.

FIG. 2 is a schematic block diagram illustrating one example of a schema 200. The illustrated schema 200 is an exemplary partial set of record entries 202 from an LDAP database schema; however, the system 100 of FIG. 1 is capable of analyzing any database 102 of organized information.

For purposes of illustration only six entries 202 are shown in FIG. 2 but it will be understood that such a database may contain many entries 202. The database 102 is capable of maintaining any number of entries 202 (referred to jointly as "entries" 202 and separately as "Entry1" 202a, "Entry2" 202b, etc.). Each of the entries 202 contains any number of attributes 204 having various different values. For example, each of the entries 202 contains the attributes Dn (distinguished name), Cn (given name), Sn, (surname), Smscapable (whether the associated device is capable of sending/receiving SMS messages), Cos (class of service), mail (email address), and Creator (the creator of the entry). However, the values corresponding to the attributes 204 vary across each of the entries 202.

Each attribute 204 has multiple possible values. For some attributes 204, for example Smscapable, the values are one of a limited number of options, such as "y" (yes) or "n" (no). For other attributes 206, for example Cn and Sn, the number of possible values is not limited due to the nature of the information stored (there is an unlimited possible variation in people's names); however, for these attributes there may be some repetition of attribute/value combinations in the set of entries. The Dn attribute is a key attribute, which uniquely identifies each entry as mandated by the LDAP standards.

Figure 3:
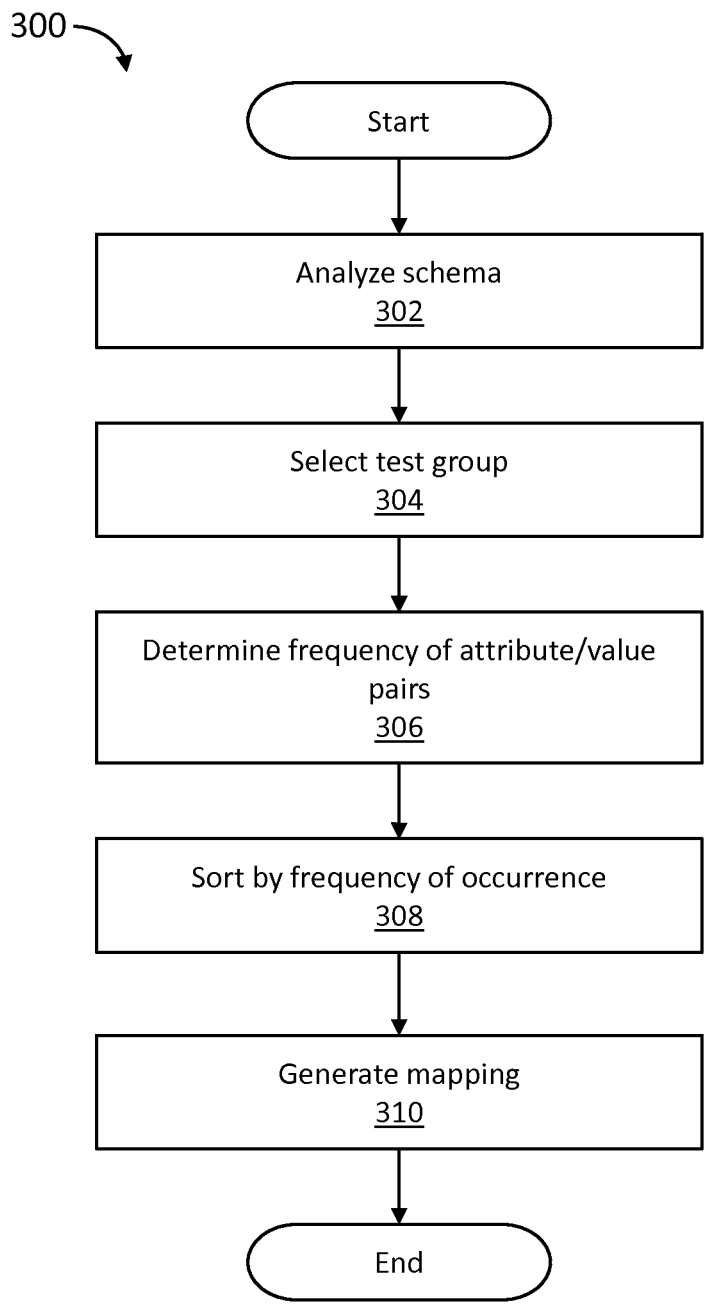
FIG. 3 is a schematic flow chart diagram illustrating a method for analyzing a database.

FIG. 3 shows an exemplary method 300 by which the controller 104, in one embodiment, analyzes the database 102 and generates a mapping 120 on the basis of the analysis. Although the method 300 is described in conjunction with the system 100 of FIG. 1, embodiments of the method 300 may be implemented with other types of database systems.

At step 302, the analyzer begins an analysis of the database 102. The analyzer 112, as part of analyzing the schema, determines the number and types of attributes in each record or entry of the database and maintains a list of all attributes of the schema. The analyzer 112 then evaluates the number and types of values associated with each attribute, according to the steps described below.

At step 304, the analyzer 112 selects a test group to analyze. The test group may comprise a random sample of entries or records from the database 102 that are to be analyzed. The size of the test group may be chosen to provide a representative sample of the database 102 so that by analyzing the test group, rather than the entire database, the analyzer may obtain a representative analysis of the entire database 102 without the burden of analyzing each and every entry.

One example of selecting random entries includes the analyzer 112 determining a first entry ID and a last entry ID and randomly selecting entries between the first and last entries. The analyzer 112 may select any number of entries or records for analysis. For example, the analyzer 112 randomly selects about 1% of the available entries in the database 102. So for a database 102 containing one million entries, the analyzer 112 may select 10,000 random entries for analysis. In another example, the analyzer 112 may select any percentage or fixed number of random entries for analysis.

At step 306, the counting engine 114 increments a counter each time the analyzer 112 finds an entry having an attribute with a given value. For example, the counting engine 114 may maintain a counter for each attribute/value pair encountered during the initial analysis of the schema (at step 302), and increment the counter associated with a specific attribute/value pair whenever that pair is found in the test group 102. In other words, for each attribute, the counting engine 114 counts the number of times each of the possible values for each attribute appear in the test group. Provided that the test group contains an appropriate number of entries (i.e. the test group is representative of the database 102), the counts can give an indication of the number of times that each attribute/value pair appears in the database 102, i.e. the frequency of occurrence of each attribute/value pair. As stated above, the schema may include many different attributes that have various different values.

At step 308, the sorting engine 116 sorts the results of the counts. In one embodiment, the sorting engine 116 sorts the attribute/value pairs based on frequency of occurrence, from highest frequency to lowest frequency.

At step 310, the mapping engine 118 generates a condensed code mapping 120 by correlating condensed codes to actual values, attributes, attribute/value pairs, or combinations of attribute value pairs, collectively referred to as character strings. The mapping engine 118 maintains a list of available condensed codes and assigns the shortest length condensed code to the character string with the highest frequency of occurrence. The mapping engine 118 is configured to iteratively assign condensed codes to the character string with the next highest frequency of occurrence until every attribute/value pair included in the assignment procedure is analyzed. As will be explained below, with reference to FIG. 4, some attribute/value pairs are excluded from being assigned codes because their frequency of occurrence is too low to warrant the computational effort of assigning a condensed code.

In some embodiments, the mapping engine 118 may assign condensed codes to frequently occurring values.

In some embodiments, the mapping engine 118 may assign condensed codes to frequently occurring attribute/value pairs; this is possible where an attribute/value pair is substantially uniform across many different entries.

In some embodiments, the mapping engine 118 may assign condensed codes to frequently occurring combinations of attribute/value pairs. An example of this may be where a large number of subscribers have a particular mobile phone that is SMS capable (i.e. Smscapable=y) and has the default Class of service (i.e. Cos: default). In this example, the mapping engine 118 may associate the attribute/value pairs Smscapable: y and Cos: default with a single condensed code.

Figure 4:
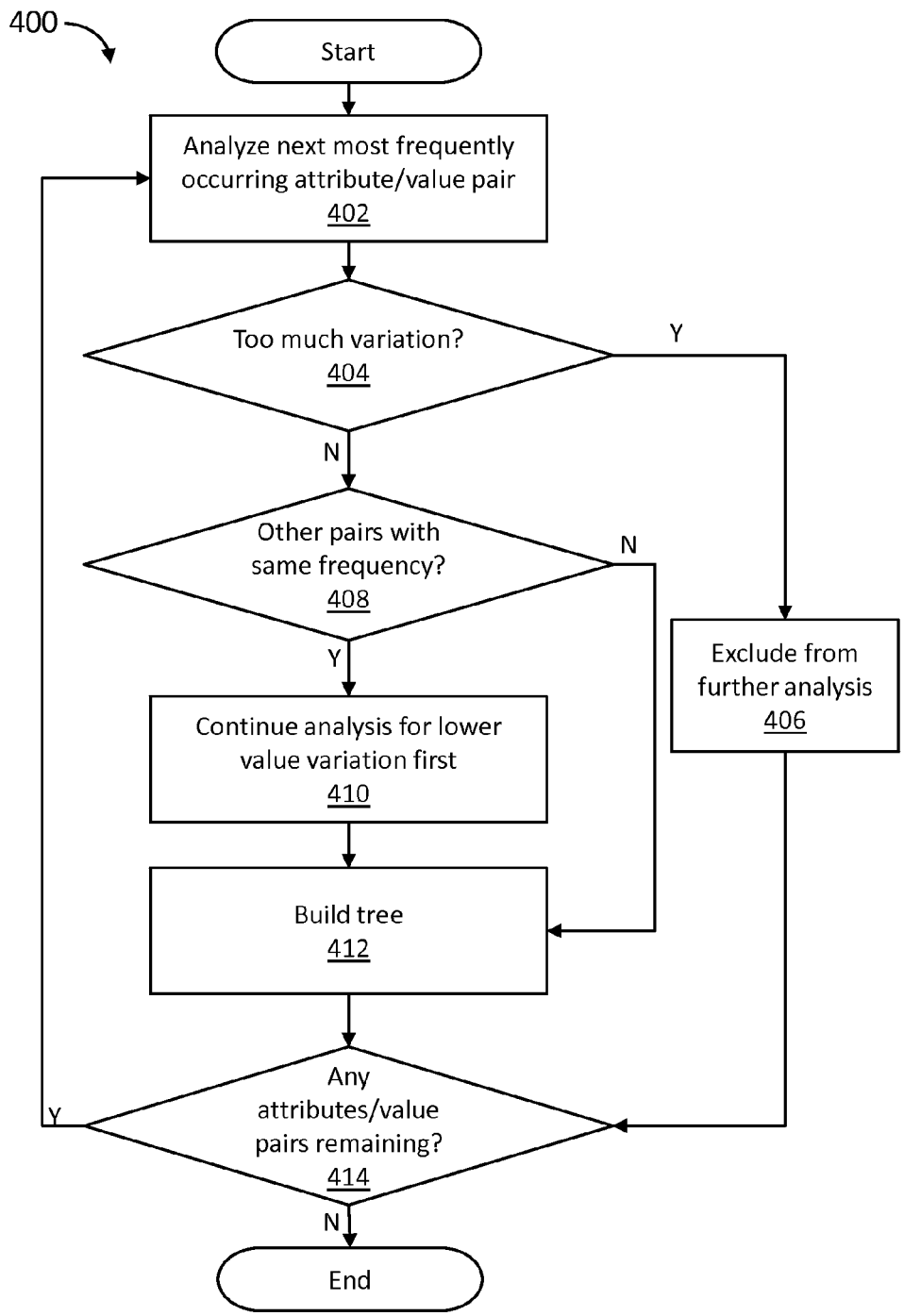
FIG. 4 is a schematic block diagram illustrating one embodiment of a method for generating a mapping.

FIG. 4 shows an exemplary method 400 for assigning condensed codes and generating a mapping 120.

At step 402, the mapping engine considers the most frequently occurring attribute/value pair.

At step 404, the mapping engine 118 determines whether the value of the attribute/value pair being analyzed has excessive variation, based on the analysis of the schema corresponding to step 302 of FIG. 3. For example, in a test group of 10,000 entries, the mapping engine 118 may determine that a value has excessive variation if it has 5,000 distinct values. This ratio of distinct values to number of entries may be predefined in the mapping engine 118, or alternatively, may be definable by a database administrator before each analysis of the database. If the variation of the values is excessive, then the mapping engine 118 may exclude that attribute/value pair from further analysis at step 406.

If, however, the mapping engine 118 determines that the value variation is not excessive, the mapping engine 118 proceeds to step 408.

At step 408, the mapping engine 118 makes a determination whether two or more attribute/value pairs have the same or similar frequencies of occurrence. If no two (or more) attribute/value pairs have the same frequency of occurrence, the mapping engine 118 proceeds to step 412.

At step 410, where two or more attribute/value pairs occur with the same, or similar, frequency of occurrence, the mapping engine 118 determines which of two or more attribute/value pairs, having the same frequency of occurrence, has the greatest variation in values. The mapping engine 118 proceeds with the condensed code assignment process for the attribute/value pair having the least value variation, based on the analysis of the schema corresponding to step 302 of FIG. 3.

At step 412, the mapping engine 118 then adds the attribute/value pair to a data structure referred to hereinafter as a "tree" that is used to determine how condensed codes should be assigned. Building of the tree is the process that the mapping engine 118 uses to determine which character strings should be assigned condensed codes, and the order in which those condensed codes should be assigned. Building of the tree is described below with reference to FIGS. 5a to 5c.

At step 414 the mapping engine determines whether there are any remaining attribute/value pairs to analyze, and if there more attribute/value pairs remain, returns to step 402 to reiterate with the next most frequently occurring attribute/value pair. If no attribute/value pairs remain to be analyzed the process ends.

FIGS. 5a to 5d show, by way of example, the application of the method of FIGS. 3 and 4 to the exemplary database set shown in FIG. 2, and in particular demonstrate the building of a tree to assign condensed codes to character strings of the database schema.

Following step 302, the analyzer 112 analyzes the schema to determine the number and types of attributes in each record or entry of the database and then evaluates the number and types of values associated with each attribute. Thus the analyzer has data identifying the variation of values associated with each attribute/value pair.

Then, in accordance with step 304, the analyzer 112 selects a test group to perform the mapping method (FIG. 4) on. However, for the purposes of explanation, it will be assumed that the six entries shown in FIG. 2 represent a test group sample of a larger database set.

The analyzer 112 then, in accordance with step 306, determines the frequency of occurrence in the test group (determined at step 304) of each attribute/value pair found in the schema (determined at step 302). The counting engine 114 maintains a count for each attribute/value pair, which is stored in memory 106.

FIG. 5a shows the results of the count representing the frequency of occurrence of each of the attribute/values pairs in the schema for the set of entries shown in FIG. 2 excluding Dn, which as described above has a unique value for each entry and so is not considered for further analysis.

FIG. 5b shows the frequency of occurrence counts of the attribute/value pairs analyzed, after sorting into order of frequency of occurrence by the sorting engine 114.

The analyzer 112 determines that Creator: root is the most frequently occurring attribute/value pair (occurring 5 times), and begins creating a frequency sorted tree with this attribute occupying the top level of the tree. The algorithm of FIG. 4 is then iterated for each of the attribute/value pairs.

As can be seen from FIGS. 5a and 5b, attributes Cn, Sn, and mail, have a high proportion of the values are unique. Cn and Sn both have 5 unique values in 6 entries, and mail has a unique value in each entry. Since the purpose of the analysis is to determine frequently occurring (or repeating) character strings, and replacing those character strings with a shortened code, it may be desirable to exclude attributes with values having a high degree of variation since any particular attribute/value pair is unlikely to arise frequently. Eliminating such attributes from further analysis can speed up the analysis and reduce the computational burden placed on the controller 104.

In the embodiment described here, attributes where more than 50% of the entries analyzed have unique values are not considered for compression and eliminated from further analysis; therefore, Cn, Sn, and mail are excluded. However, it will be understood that the threshold for eliminating attributes from further analysis may be configurable depending on a given application.

For attributes that will be considered for compression, namely Smscapable, Cos, and Creator, the analyzer 112 builds a tree in accordance with the steps of the algorithm of FIG. 4 and the logic described below.

Figure 5C:
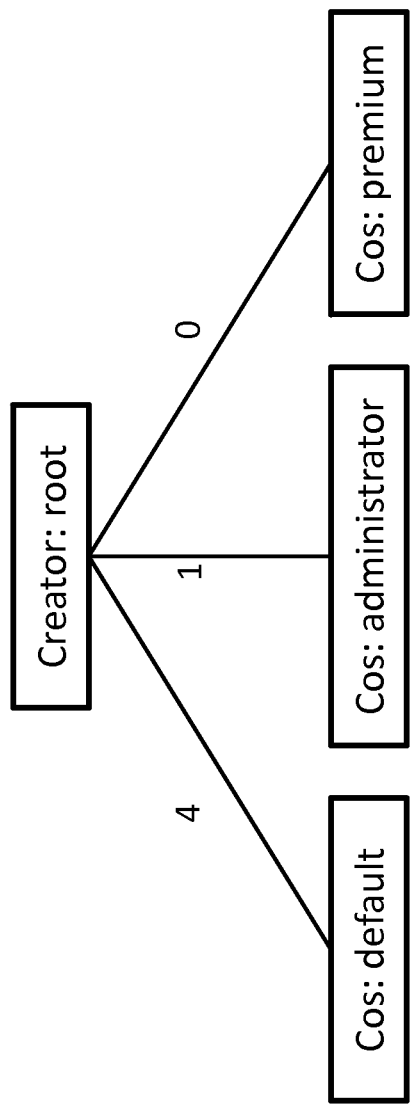
FIG. 5c is a schematic block diagram illustrating first and second levels of a tree for generating a mapping.

FIG. 5c shows the first (top) and second levels of the tree. The node at the top level of the tree is populated with the attribute/value pair that the analyzer 112 determines is the most frequently occurring. From the sorted results shown in FIG. 5b, we can see that Creator: root is the most frequently occurring attribute/value pair and as such it is used to populate the top level node.

The nodes at the second level of the tree are populated with the attribute/value pairs of the attribute that has the next most frequently occurring attribute/value pair. As can be seen from FIG. 5b, the next most frequently occurring attribute/value pair (after Creator: root) is Cos: default (occurring four times). Therefore, the mapping engine 118, populates nodes at the second level of the tree with the attribute/value pairs for the Cos attribute.

The weightings assigned to each edges of the tree between the first and second levels represent the frequency of occurrence of the combination the attribute/value pairs making up that branch of the tree. Therefore, the weighting of, for example, Creator: root; Cos: premium is 0 because Cos: premium exists only in combination with Creator: customercare, and not in combination with Creator: root.

Figure 5D:
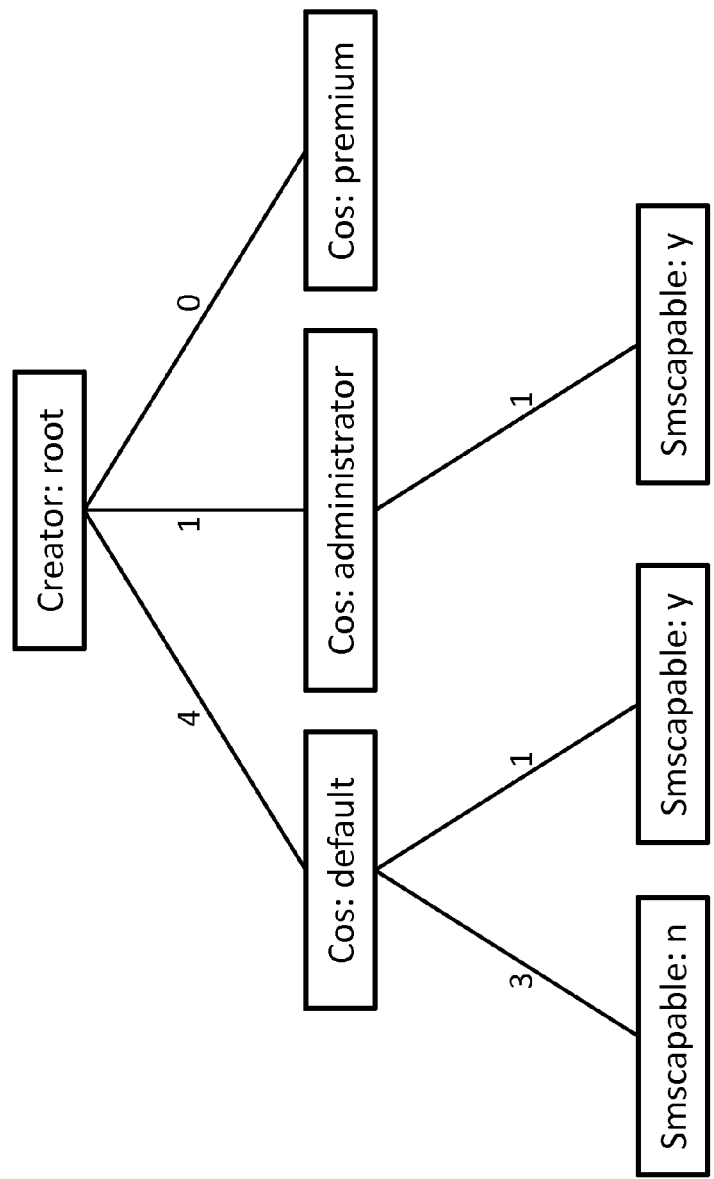
FIG. 5d is a schematic block diagram illustrating first, second and third levels of a tree for generating a mapping.

FIG. 5d shows the creation of the next (third) level of the tree. The mapping engine 118 populates the nodes at the third level in the same manner that the nodes at the second level was populated. FIG. 5b shows that Smscapable is the attribute with the next most commonly occurring attribute/value pair (Smscapable: y, and Smscapable: n both occur 3 times). The nodes at the third level are therefore populated with the Smscapable attribute/value pairs. Again the weightings on the edges of the tree between the second and third levels relate to the combined frequency of occurrence of the combination of each attribute/value pairs along the particular branch of the tree. Therefore, since the combination of Smscapable: y, Cos: default, and Creator: root only occurs once, the weighting of the edge between the second and third levels joining the Cos: default node and the Smscapable: y node has a value of 1.

The mapping engine 118 may also eliminate attribute/value pairs, and/or combinations of attribute/value pairs that having a frequency of occurrence lower than a threshold value. This is for the same reason described above in relation to the analysis of the schema; that is that in order to prioritize the computational efforts in order to most efficiently analyze the database and generate the codes, only the most frequently occurring attribute/value pairs and combinations of pairs (character strings) are assigned codes, as this provides the most benefit in terms of minimizing storage utilization.

For example, the mapping engine 118 may exclude from the tree attribute/value pairs, or combinations of attribute/value pairs having a frequency of occurrence that is less than 20% of the sample size. Therefore, for the test group shown in FIG. 2, which has six entries, attribute/value pairs, or combinations of pairs that occur less than twice are excluded from the tree. This is shown schematically in FIG. 5e.

Once all non-excluded attributes have been analyzed, there are no more layers to add to the tree. The mapping engine 118, then maps condensed codes against the attribute/value pairs and combination of attribute/value pairs (character strings) in a bottom-up manner, such that the character string with the most frequently occurring combination of attribute/value pairs that spans all of the levels of the tree is assigned the shortest condensed code.

Figure 5E:
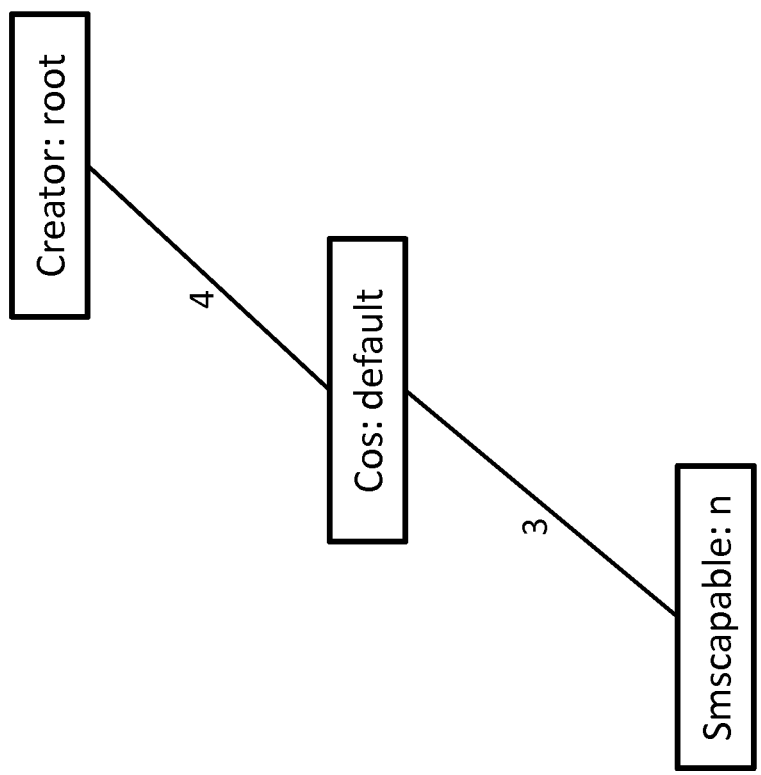
FIG. 5e is a schematic block diagram illustrating a first, second and third levels of a tree for generating a mapping.

However, it can be seen from FIG. 5d that sub-combinations that do not extend to the lowest level of the tree also occur frequently without the attribute/value pairs at lower levels of the tree; it is just that the analysis stopped exploring other lower level branches for the purposes of assigning codes specifically for those low level combinations due to the relative infrequency of their occurrence. For example, the combination Creator: root; Cos: default, can be combined with Smscapable: y, and indeed other attribute/value pairs not defined in the final tree (FIG. 5e). Therefore, there is benefit in assigning condensed codes to combinations that extend less far down the tree in addition to the full length combination.

Figure 6:
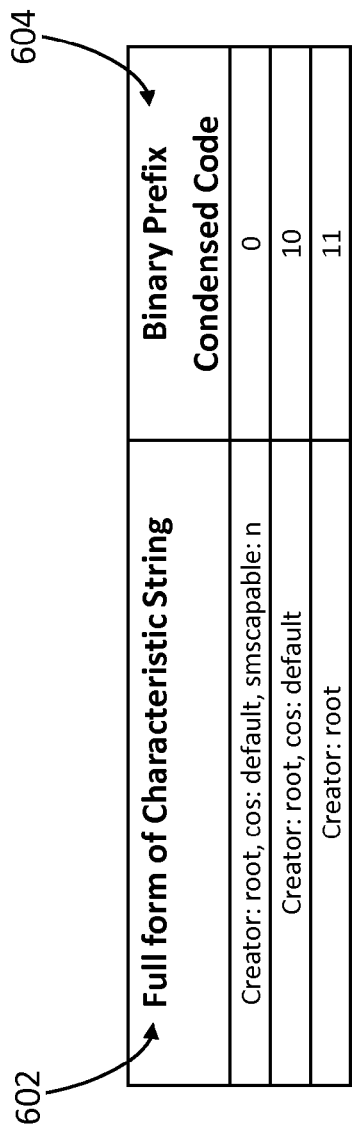
FIG. 6 is a table depicting a mapping for an exemplary database.

For the example set of entries shown in FIG. 2, and using the analysis described above, the mapping engine 118 may, for example, assign the condensed codes to the combinations starting at the bottom of the tree and working up, assigning the shortest codes to the combinations extending furthest down the tree, as shown in FIG. 6. These condensed codes are generated and added to the mapping 120.

Since Creator: root; Cos: default; Smscapable: n is the most frequently occurring character string that extends through all levels of the tree (and therefore there will provide the greatest benefit from being abbreviated by a condensed code), it is assigned the shortest code. In the example shown in FIG. 6, the shortest code is \0, and this code is assigned to the character string Creator: root; Cos: default; Smscapable: n.

Subsequent character strings that extend across fewer levels are iteratively assigned codes until character strings spanning all numbers of levels (first, first and second, and first, second and third) are assigned codes.

As can be seen from FIG. 5e, some of the attribute/value pairs will be excluded from the tree because in combination with more popular attribute/value pairs they do not occur frequently (i.e. there is little correlation between the attribute/value pairs). However, in isolation, they may appear relatively frequently, as is the case for Smscapable: y for example, and so it may be advantageous to assign codes to such attribute/value pairs. For example, a common surname may occur frequently in the database schema, but not correlate with the frequent occurrence of any other attributes and so be removed from the tree; however, by assigning the surname a code, some space saving may still be achieved.

Finally, individual attributes or values which occur frequently may be assigned condensed codes, if the condensed code is shorter than the full form name of the attribute or value.

In the example shown in FIG. 6, the assigned codes are variable length binary prefix codes. By using binary prefix codes, no code that is assigned to one character string is used as a prefix (i.e. the first characters) of a subsequently assigned longer condensed code. This prevents combinations of condensed codes being misinterpreted as longer codes. However, in some embodiments the mapping engine 118 assigns simpler codes can to the character strings, the condensed codes to character strings based on alternative criteria, for example based on an incrementing sequence of numbers (for example, 1, 2, 3, 4, . . . n). In other words, any coding scheme may be implemented to replace character strings with condensed codes provided that the condensed code is shorter than the actual character string and the codes are each unique codes not previously used and not representing an actual character string.

FIG. 6 is a mapping 120 generated for the entries shown in FIG. 2 based on the method described with reference to FIGS. 3 to 5e. The mapping 120 is an index of character strings in their full form 602 and corresponding condensed codes 604. The mapping 120 illustrated in FIG. 6 is given by way of example only, to illustrate one possible mapping 120 based upon the character strings 602 of the database 102 that the analyzer 112 has determined are good candidates for replacement with condensed codes.

Although in the above embodiment the shortest condensed codes are assigned to the character string that extends across all levels of the tree with the highest frequency of occurrence, the assignment of codes may be performed using an alternative criteria.

In one embodiment, the length of the character string (i.e. the number of characters making up the character string)

may be taken into account when assigning the codes. For example, the mapping engine 118 may take a product of the length of the character strings and their frequencies of occurrence to produce a ranking, and assign the shortest codes to the character string having the highest ranking. This might enable a higher degree of compression in cases where there are long character strings that occur less frequently than other, shorter character strings.

For example, where a first character string, "abcde", occurs 10 times and a second character string, "aaaaabbbbbccccc", occurs 5 times, the products of the string length and the frequency of occurrence are 75 for the first string and 50 for the second (more frequently occurring) string. Therefore, the mapping engine 118 might assign the shortest condensed code to first string, because it is ranked higher and therefore provides the greater degree of compression, despite it occurring less frequently. As users update their information, and consequently the character strings 602 of the database 102 change, the mapping 120 may be updated to reflect those changes. In other words, the assignment of condensed codes 604 may change from one analysis of the database 102 to the next analysis.

The mapping engine 118 may generate multiple mappings 120. For example, over time, as data in the database 102 changes, the mapping 120 may become very large, and a new mapping 120 may become desirable. During a transition period from the old mapping to a new mapping 120, both mappings 120 may be used to compress the database 102 and translate condensed codes, with the particular relevant mapping 120 identified by a unique mapping identifier.

In some embodiments, the mapping engine 118 also may assign a flag to precede or follow the condensed code 604. The flag signals to the controller 104 that the value is a condensed code 604 instead of the actual full form of the character string. The flag may also identify the mapping 120 associated with the flag. As described above, the mapping engine 118 may generate multiple mappings 120, where each mapping 120 has a unique identifying flag. The flag may be any character that is not used in the condensed code 604.

Figure 7:
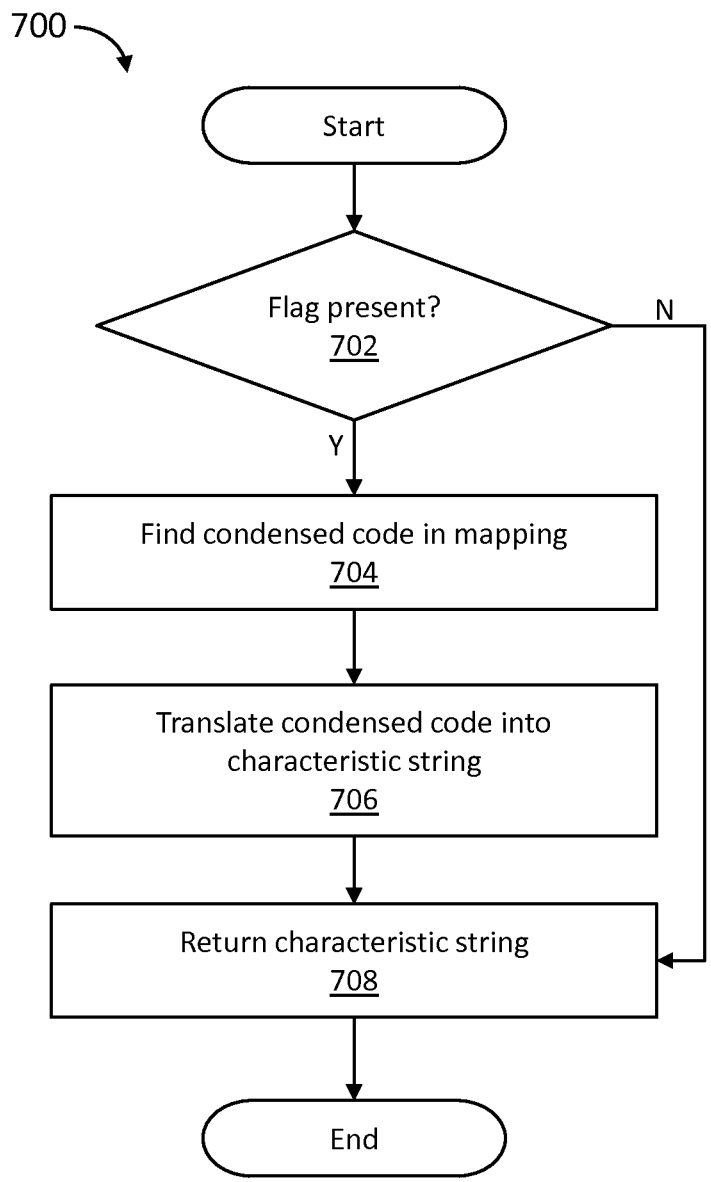
FIG. 7 is a schematic flow chart diagram illustrating one embodiment of a method for retrieving a value from a database.

FIG. 7 is a schematic flow chart diagram illustrating one embodiment of a method 700 for retrieving a value from a database. Although the method 700 is described in conjunction with the system 100 of FIG. 1, embodiments of the method 700 may be implemented with other types of database systems.

As described above, the controller 104 of FIG. 1 is capable of receiving read/write requests. A read request, for example, is a request to retrieve a specific value of an attribute from an entry in the database. The controller 104 queries the database 102 using commands specific to the schema of the database. As described previously, the mapping engine 118 may precede or follow a condensed code 604 with a flag to identify the value as a condensed code 604 instead of an actual full form version of the character string.

The controller 104, in one embodiment, determines at step 702 if a flag is present. If a flag is present, the controller 104 finds at step 704 the condensed code 604 in the mapping 120. At step 706, the controller 104 translates the condensed code 604 into an actual full form character string by consulting the mapping 120 and identifying the full form character string that is associated with the condensed code 604 retrieved from the database 102. The controller 104 then returns at step 708 the full form character string to the device or service that requested the character string. However, if at step 702 the controller 104 determines that a flag is not present, the controller returns at step 708 the full form character string without consulting the mapping 120 and the method 700 ends.

Figure 8:
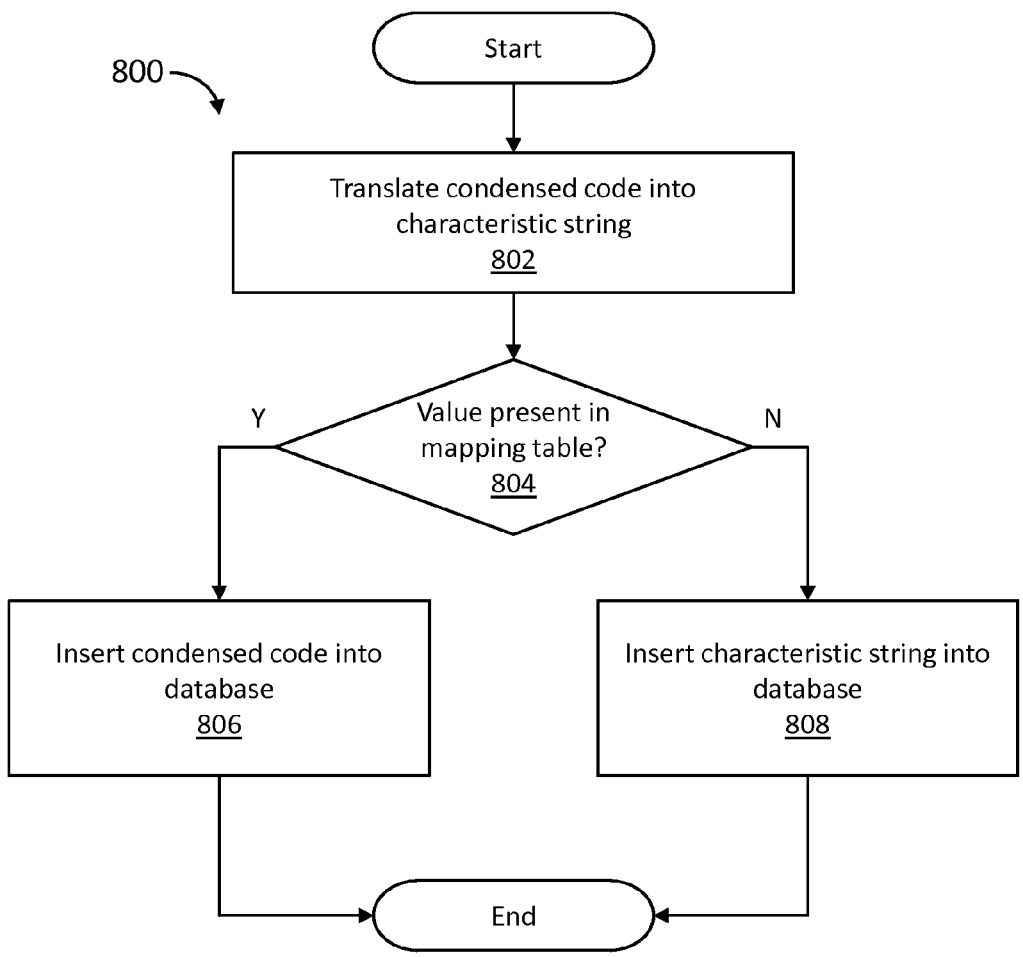
FIG. 8 is a schematic flow chart diagram illustrating one embodiment of a method for writing a value to the database.

FIG. 8 is a schematic flow chart diagram illustrating one embodiment of a method 800 for writing a value to the database 102. Although the method 800 is described in conjunction with the system 100 of FIG. 1, embodiments of the method 800 may be implemented with other types of database systems.

The controller 104, in one embodiment, first receives, at step 802, an incoming entry.

At step 804, the controller 104 determines if any character strings of the entry are present in the mapping 120 and, if so, translates the character strings into a corresponding condensed code 604. The controller 104 may insert a flag to indicate that the data is compressed. The flag may be any character that is node used in the condensed code 604.

If the controller 104 determines, at step 804, that one or more corresponding condensed codes 604 has been identified in the mapping 120 for the new entry, the controller 104 inserts the condensed code 604 into the database 102 at step 806.

However, if the controller 104 determines, at step 804, that no corresponding condensed codes 604 have been identified for the new entry in the mapping 120, the controller 104 inserts the actual full form of the character string into the database 102 at step 808.

An embodiment of a database system includes at least one processor coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

It should also be noted that at least some of the operations for the methods may be implemented using software instructions stored on a computer usable storage medium for execution by a computer. As an example, an embodiment of a computer program product includes a computer usable storage medium to store a computer readable program that, when executed on a computer, causes the computer to perform operations, including an operation to monitor a pointer movement in a web page. The web page displays one or more content feeds. In one embodiment, operations to report the pointer movement in response to the pointer movement comprising an interaction gesture are included in the computer program product. In a further embodiment, operations are included in the computer program product for tabulating a quantity of one or more types of interaction with one or more content feeds displayed by the web page.

Embodiments of the invention can take the form of an entirely hardware embodiment, an entirely software embodiment, or an embodiment containing both hardware and software elements. In one embodiment, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-usable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or storage devices through intervening private or public networks. Modems, cable modems, and Ethernet cards are just a few of the currently available types of network adapters.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A database compression system comprising
at least one processor and at least one memory, the at least one memory being configured, with the at least one processor, to:
analyze a schema of a database by maintaining a list of attributes and corresponding values and analyze a selection of entries in the database;
determine a frequency of occurrence of each attribute/value pair in the selection of entries in the database;
generate a data structure comprising a plurality of levels, wherein each level represents a different one of the attributes,
wherein a highest level in the data structure comprises a node representing the attribute/value pair having the highest frequency of occurrence in the selection of entries in the database, and wherein each subsequent level in the data structure comprises a node representing an attribute/value pair having a frequency of occurrence in the selection of entries in the database that is the same as, or the next highest to, the highest frequency of occurrence in the selection of entries in the database of an attribute/value pair in the level above;
determine which combinations of attribute/value pairs spans all of the levels of the data structure;
determine a frequency at which each of the combinations of attribute/value pairs that span all levels of the data structure occur in combination in the selection of entries in the database;
determine which combination of attribute/value pairs that spans all of the levels of the data structure occurs in combination in the selection of entries in the database with the highest frequency;
assign a condensed code to a character string that comprises the combination of attribute/value pairs that spans all of the levels of the data structure and occurs in combination in the selection of entries in the database with the highest frequency; and
compress the database by replacing the character string with the condensed code.

2. The database compression system of claim 1, wherein a shortest available condensed code is assigned to the character string.

3. The database compression system of claim 1, wherein the database compression system is configured to assign a further available condensed code to a further character string that comprises a further combination of attribute/value pairs selected from the combination of attribute/value pairs that spans all of the levels of the data structure with the highest frequency of occurrence in the selection of entries in the database, the further combination of attribute/value pairs spanning a sub section of the levels only.

4. The database compression system of claim 1, wherein the database compression system is configured to exclude, from the data structure, nodes representing attribute/value pairs that, in combination with the attribute/value pairs at higher levels of the data structure, have a frequency of occurrence in the selection of entries in the database that is below a threshold frequency of occurrence.

5. A database compression system comprising
at least one processor and at least one memory, the at least one memory being configured, with the at least one processor, to:
analyze a schema of a database by maintaining a list of attributes and corresponding values and analyze a selection of entries in the database;
determine a frequency of occurrence of each attribute/value pair in the selection of entries in the database;
generate a data structure comprising a plurality of levels, each level representing a different one of the attributes,
wherein a highest level in the data structure comprises a node representing the attribute/value pair having the highest frequency of occurrence in the selection of entries in the database, and wherein each subsequent level in the data structure comprises a node representing an attribute/value pair having a frequency of occurrence in the selection of entries in the database that is the same as, or the next highest to, the highest frequency of occurrence in the selection of entries in the database of an attribute/value pair in the preceding level;

determine which combinations of attribute/value pairs span all of the levels of the data structure;

determine a frequency at which each of the combinations of attribute/value pairs that span all levels of the data structure occur in combination in the selection of entries in the database;

determine a length of each character string comprising a combination of attribute/value pairs that spans all of the levels of the data structure;

assign a shortest condensed code to a character string that comprises a combination of attribute/value pairs that spans all of the levels of the data structure based on a determined frequency at which the respective combinations of attribute/value pairs that span all levels of the data structure occur in combination in the selection of entries in the database and the determined length of the character string; and compress the database by replacing the character string with the condensed code.

6. The database compression system of claim 5, wherein the database compression system is further configured to determine the character string on the basis of a product of the frequency of occurrence in the selection of entries in the database of, and the number of characters in, the character string.

7. The database compression system of claim 1, further comprising a sorting engine configured to sort the attribute/value pairs from highest frequency of occurrence to lowest frequency of occurrence in the selection of entries in the database.

8. The database compression system of claim 1, wherein the mapping engine is further configured to prioritize an attribute having a lower number of distinct values when multiple attribute/value pairs have substantially equivalent frequency of occurrences in the selection of entries in the database and/or wherein the mapping engine is further configured to exclude attribute/value pairs with excessive attribute value variation, and wherein excessive attribute value variation is a predetermined ratio of distinct values to number of entries in the selection of entries.

9. The database compression system of claim 1, wherein the mapping engine is further configured to generate a mapping of character strings and corresponding condensed codes.

10. The database compression system of claim 9, wherein the mapping engine is further configured to insert a flag adjacent the condensed code in the mapping, and wherein the flag is indicative of a condensed code representative of a character string.

11. The database compression system of claim 10, further comprising a controller configured to:

query a database and retrieve a condensed code;
detect if the condensed code has the flag; and
translate the condensed code into the character string.

12. The database compression system of claim 11, wherein the controller is further configured to:

receive an incoming character string to write to the database;
determine if the character string exists in the mapping; and
translate the character string into the condensed code and insert the condensed code into the database.

13. The database compression system of claim 12, wherein the analyzer is further configured to select a random group of entries in the database, the random group of entries representing in the range of between about 1 and 30% of the database, and wherein the database is a subscriber database for storing information relating to subscribers of a telecommunications network, and wherein the database implements an application protocol for reading and/or writing values over a communications network.

14. The database compression system of claim 1, wherein weightings assigned between pairs of nodes in successive levels in the data structure represent a frequency of occurrence in the selection of entries of combinations of attribute/value pairs.

15. A method of compressing data in a database, the method comprising:

analyzing a schema of a database by maintaining a list of attributes and corresponding values and analyzing a selection of entries in the database;

determining a frequency of occurrence of each attribute/value pair in the selection of entries;

generating a data structure comprising a plurality of levels, each level representing a different one of the attributes, wherein a highest level in the data structure comprises a node representing the attribute/value pair having the highest frequency of occurrence in the selection of entries in the database, and wherein each subsequent level in the data structure comprises a node representing an attribute/value pair having a frequency of occurrence in the selection of entries in the database that is the same as, or the next highest to, the highest frequency of occurrence in the selection of entries in the database of an attribute/value pair in the level above;

determining which combinations of attribute/value pairs span all of the levels of the data structure;

determine a frequency at which each of the combinations of attribute/value pairs that span all levels of the data structure occur in combination in the selection of entries in the database;

determine which combination of attribute/value pairs that spans all of the levels of the data structure occurs in combination in the selection of entries in the database with the highest frequency of occurrence;

assigning a condensed code to a character string that comprises the combination of attribute/value pairs that spans all of the levels of the data structure and occurs in combination in the selection of entries in the database with the highest frequency; and compressing the database by replacing the character string with the condensed code.

16. The method of claim 15, wherein the shortest available code is assigned to the character string.

17. The method of claim 16, further comprising:

assigning a further available condensed code to a character string that comprises a further combination of attribute/value pairs selected from the combination of attribute/value pairs that spans all of the levels of the data structure with the highest frequency of occurrence in the selection of entries in the database, the further combination of attribute/value pairs spanning a sub section of the levels only; or excluding, from the data structure, nodes representing attribute/value pairs that, in combination with the attribute/value pairs at higher levels of the data structure, have a frequency of occurrence in the selection of entries in the database that is below a threshold frequency of occurrence.

18. A method of compressing data in a database, the method comprising:
- analyzing a schema of a database by maintaining a list of attributes and corresponding values and analyzing a selection of entries in the database;
- determining a frequency of occurrence of each attribute/value pair in the selection of entries;
- generating a data structure comprising a plurality of levels, each level representing a different one of the attributes,
- wherein a highest level in the data structure comprises a node representing the attribute/value pair having the highest frequency of occurrence in the selection of entries in the database, and wherein each subsequent level in the data structure comprises a node representing an attribute/value pair having a frequency of occurrence in the selection of entries in the database that is the same as, or the next highest to, the highest frequency of occurrence in the selection of entries in the database of an attribute/value pair in the preceding level;
- determining which combinations of attribute/value pairs span all of the levels of the data structure;
- determining a frequency at which each of the combinations of attribute/value pairs that span all levels of the data structure occur in combination in the selection of entries in the database;
- determining a length of each character string comprising a combination of attribute/value pairs that spans all of the levels of the data structure;
- assigning a shortest available condensed code to a character string that comprises a combination of attribute/value pairs that spans all of the levels of the data structure based on a determined frequency at which the respective combinations of attribute/value pairs that span all levels of the data structure occur in combination in the selection of entries in the database and the determined length of the character string; and
- compressing the database by replacing the character string with the condensed code.

19. A non-transitory computer-readable storage medium comprising a set of computer-readable instructions stored thereon, which when executed by a processing system, cause the processing system to perform a method of compressing data in a database, the method comprising:
- analyzing a schema of a database by maintaining a list of attributes and corresponding values and analyzing a selection of entries in the database;
- determining a frequency of occurrence of each attribute/value pair in the selection of entries in the database;
- generating a data structure comprising a plurality of levels, each level representing a different one of the attributes,
- wherein a highest level in the data structure comprises a node representing the attribute/value pair having the highest frequency of occurrence in the selection of entries in the database, and wherein each subsequent level in the data structure comprises a node representing an attribute/value pair having a frequency of occurrence in the selection of entries in the database that is the same as, or the next highest to, the highest frequency of occurrence in the selection of entries in the database of an attribute/value pair in the level above;
- determine which combinations of attribute/value pairs span all of the levels of the data structure;
- determine a frequency at which each of the combinations of attribute/value pairs that span all levels of the data structure occur in combination in the selection of entries in the database;
- determine which combination of attribute/value pairs that spans all of the levels of the data structure occurs in combination in the selection of entries in the database with the highest frequency of occurrence;
- assigning a condensed code to a character string that comprises the combination of attribute/value pairs that spans all of the levels of the data structure and occurs in combination in the selection of entries in the database with the highest frequency; and
- compressing the database by replacing the character string with the condensed code.

* * * * *